(12) United States Patent
Masuda et al.

(10) Patent No.: US 8,652,642 B2
(45) Date of Patent: *Feb. 18, 2014

(54) BIAXIALLY ORIENTED POLYESTER FILM

(75) Inventors: Narihiro Masuda, Maibara (JP);
Takaaki Kojima, Maibara (JP);
Thorsten Kiehne, Maibara (JP)

(73) Assignee: Mitsubishi Plastics, Inc., Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 13/391,835

(22) PCT Filed: Sep. 13, 2010

(86) PCT No.: PCT/JP2010/065730
§ 371 (c)(1),
(2), (4) Date: Mar. 26, 2012

(87) PCT Pub. No.: WO2011/034024
PCT Pub. Date: Mar. 24, 2011

(65) Prior Publication Data
US 2012/0177932 A1    Jul. 12, 2012

(30) Foreign Application Priority Data

Sep. 17, 2009  (JP) ................................. 2009-215245
May 19, 2010  (JP) ................................. 2010-114828

(51) Int. Cl.
*B32B 27/40*  (2006.01)
*B32B 27/36*  (2006.01)
*B32B 27/30*  (2006.01)
*B32B 27/32*  (2006.01)

(52) U.S. Cl.
USPC ................ 428/423.7; 428/424.4; 428/424.8; 428/480; 428/522; 428/523

(58) Field of Classification Search
USPC ......... 428/424.4, 424.8, 480, 522, 523, 423.7
See application file for complete search history.

(56) References Cited

U.S. PATENT DOCUMENTS

| 8,507,791 B2 * | 8/2013 | Suzuta et al. ................. 136/259 |
| 2010/0035050 A1 * | 2/2010 | Okawara et al. .............. 428/336 |
| 2010/0283946 A1 | 11/2010 | Ueda et al. |
| 2013/0065063 A1 * | 3/2013 | Masuda et al. ............. 428/423.7 |

FOREIGN PATENT DOCUMENTS

| JP | 2005/179486 | 7/2005 | |
| JP | 2005-179486 | 7/2005 | |
| JP | 2007/204538 | 8/2007 | |
| JP | 2007-204538 | 8/2007 | |
| JP | 2009-193061 | 8/2009 | |
| WO | WO 2007148754 A1 * | 12/2007 | ............. B32B 27/40 |

OTHER PUBLICATIONS

International Search Report for PCT/JP2010/065730, mailed Nov. 16, 2010.

* cited by examiner

*Primary Examiner* — Thao T. Tran
(74) *Attorney, Agent, or Firm* — Nixon & Vanderhye P.C.

(57) ABSTRACT

The present invention provides a polyester film which is excellent in hydrolysis resistance of a base film, is hardly deteriorated in adhesion property to various members or top-coating agents, and can suitably used, for example, as a film for a protective member for protecting a back surface of solar cells. The present invention relates to a biaxially oriented polyester film in the form of a laminated film comprising a biaxially oriented polyester base film having a phosphorus element content of 0 to 170 ppm and a terminal carboxylic acid content of not more than 26 equivalents/t, and a coating layer formed on at least one surface of the biaxially oriented polyester base film which comprises a polyurethane having a polycarbonate skeleton or a polyether skeleton and a crosslinking agent, wherein the laminated film has a haze value of not more than 10%.

6 Claims, No Drawings

BIAXIALLY ORIENTED POLYESTER FILM

This application is the U.S. national phase of International Application No. PCT/JP2010/065730, filed 13 Sep. 2010, which designated the U.S. and claims priority to Japan Application No. 2009-215245, filed 17 Sep. 2009; and Japan Application No. 2010-114828, filed 19 May 2010, the entire contents of each of which are hereby incorporated by reference.

TECHNICAL FIELD

The present invention relates to a biaxially oriented polyester film having an easy-bonding property, and more particularly, to a polyester film which is excellent in hydrolysis resistance of a base film, hardly deteriorated in film properties even when used under high-temperature and high-humidity environmental conditions or outdoors for a long period of time as well as hardly deteriorated in adhesion property to various members or top-coating agents, and can be suitably employed as a film for a protective member for protecting a back surface of solar cells.

BACKGROUND ART

The "protective member for protecting a back surface of solar cells" as described therein means, in particular, such a member which is used for the purpose of preventing water from penetrating into the solar cells from a back surface side thereof onto which sunlight is not directly irradiated. The protective member is required to have properties such as gas-barrier property, hydrolysis resistance, breakdown resistance, etc. In general, a glass plate has been used as the protective member. However, the glass palate has a less flexibility and causes increase in total weight of the solar cells. Therefore, there is a demand for alternate synthetic resin films which have a light weight and a good flexibility and are capable of satisfying the above various properties as required. Under these circumstances, studies have been made on use of a polyester film as one of these synthetic resin films, which is excellent in mechanical properties, thermal properties, chemical resistance, etc.

On the other hand, as described, for example, in Japanese Utility Model Application Laid-Open (JIKKAI) No. 6-38264, the solar cell module generally has such a structure that a plurality of plate-shaped solar cell elements are intervened between the glass plate disposed on a light-receiving side and a protective membrane disposed on a rear side of the solar cells, and a sealing resin is filled in a clearance inside of the cell. As the sealing resin, a sheet of an ethylene-vinyl acetate copolymer (hereinafter referred to merely as "EVA") may be frequently used because it is excellent in transparency, moisture resistance and flexibility.

Further, as the sealing resins other than EVA, there are also known polyvinyl butyral (PVB), ethylene-methyl acrylate copolymers (EMA), ethylene-ethyl acrylate copolymers (EEA), ethylene-α-olefin-copolymers or the like.

The polyester films are used as the protective member for protecting a back surface of solar cells by thermally bonding to the above sheet of EVA, etc. However, the polyester films usually have an inert surface, and therefore tend to be deteriorated in adhesion to EVA, etc. For this reason, in order to improve an adhesion property of the polyester films to EVA, etc., there has been proposed the method of providing an easy-bonding layer on a surface of the polyester films (Patent Document 1).

Also, the protective member for protecting a back surface of solar cells has been conventionally employed on the premise that it is used outdoors over a long period of time (for example, over 20 years or longer) and therefore may be exposed to high-temperature and high-humidity environmental conditions. In such a case, as recognized, there tends to occur such a problem that the polyester films suffer from hydrolysis at an ester bond moiety in a molecular chain thereof, so that mechanical properties of the film itself tend to be deteriorated with time. In addition, as another problem, there tends to occur such a fear that an easy-bonding layer provided in the polyester films for improving a thermal bonding property thereof to EVA, etc., is also deteriorated with time under high-temperature and high-humidity environmental conditions, thereby failing to maintain a good adhesion property of the polyester films to EVA, etc.

On the other hand, the solar cells require high initial costs, and an electricity obtained by the solar cells is very expensive as compared to that generated from fossil fuel. Therefore, in order to attain a wide spread of the solar cells, it is necessary to suppress a price of the solar cells. For this reason, it is an important technical background that the protective member for protecting a back surface of the solar cells is formed of a generally-use material as possible to suppress the price of the solar cells.

It is known that the rate of hydrolysis of a polyester becomes higher as a terminal carboxylic acid content in a molecular chain of the polyester is increased. Therefore, there has been proposed such a technique that the carboxylic acid being present in a terminal end of a molecular chain of the polyester is esterified with an epoxy compound to reduce a terminal carboxylic acid content in the polyester and thereby enhance a hydrolysis resistance of the polyester (Patent Document 2). However, the epoxy compound tends to induce gelation of the material upon melt extrusion step in a film formation process or a material recycling process to generate foreign matters, resulting in disadvantages from the viewpoints of environments and costs.

Also, there has been proposed the technique that a terminal carboxylic acid content in the polyester is reduced by adding a carbodiimide such as a polycarbodiimide thereto (Patent Document 3). However, the carbodiimide itself tends to undergo thermal deterioration, so that there is a tendency that the polyester suffers from coloration or deterioration in properties depending upon the reaction conditions used.

In addition, it is known that hydrolysis of the polyester is promoted under acid or alkali environmental conditions (Non-Patent Document 1). Therefore, it is considered that a phosphorus compound such as phosphoric acid and phosphorous acid which is added as a stabilizer for the purpose of preventing undesirable coloration of the polyester upon a polymerization reaction for production thereof gives an adverse influence on hydrolysis resistance thereof because the reaction system becomes acidic upon adding the phosphorus compound thereto.

To solve the problems, there has been proposed the technique that the terminal carboxylic acid content in a polyester is restricted to a predetermined value or lower, and a predetermined amount of a specific phosphoric acid ester is incorporated in the polyester to enhance a hydrolysis resistance thereof (Patent Document 4). However, since the phosphoric acid ester used in the technique has a specific structure, the technique further requires a step of preparing the phosphoric acid ester and costs therefor. Therefore, the technique described in Patent Document 4 is unsuitable for providing a polyester film which can be used outdoors for a long period of time (for example, over 20 years or longer).

Prior Documents

Patent Documents

Patent Document 1: Japanese Patent Application Laid-Open (KOKAI) No. 2006-175764
Patent Document 2: Japanese Patent Application Laid-Open (KOKAI) No. 9-227767
Patent Document 3: Japanese Patent Publication (KOKOKU) No. 38-152220
Patent Document 4: Japanese Patent Application Laid-Open (KOKAI) No. 8-3428

Non-Patent Documents

Non-Patent Document 1: Kazuo Yuki, "HANDBOOK OF SATURATED POLYESTER RESINS", published by Kosaido Co., Ltd., 1989

DISCLOSURE OF THE INVENTION

Problems to be Solved by the Invention

The present invention has been accomplished to solve the above problems. An object of the present invention is to provide a polyester film which is excellent in hydrolysis resistance of a base film, is hardly deteriorated in adhesion property to various members or top-coating agents, and can suitably used, for example, as a film for a protective member for protecting a back surface of solar cells.

Means for Solving Problems

As a result of the present inventors' earnest study, it has been found that the above problems can be readily solved by using a biaxially oriented polyester film having a specific structure. The present invention has been attained on the basis of this finding.

That is, according to the present invention, there is provided a biaxially oriented polyester film in the form of a laminated film comprising a biaxially oriented polyester base film having a phosphorus element content of 0 to 170 ppm and a terminal carboxylic acid content of not more than 26 equivalents/t, and a coating layer formed on at least one surface of the biaxially oriented polyester base film which comprises a polyurethane having a polycarbonate skeleton or a polyether skeleton and a crosslinking agent, wherein the laminated film has a haze value of not more than 10%.

Effect of the Invention

The biaxially oriented polyester film according to the present invention is excellent in hydrolysis resistance of a film itself, is hardly deteriorated in quality of the film even when used for a long period of time under high-temperature and high-humidity environmental conditions or outdoors, and also hardly deteriorated in adhesion property to various members or top-coating agents such as EVA and PVB. In addition, the biaxially oriented polyester film of the present invention is excellent in transparency, and can be obtained from generally used materials without using any specific materials, so that the price of the film can be suppressed. For this reason, the biaxially oriented polyester film of the present invention can be suitably used in the applications under severe environmental conditions, for example, such as a film for a protective member for protecting a back surface of solar cells, a film for touch panels and a film for liquid crystal displays. Therefore, the present invention has a very high industrial value.

PREFERRED EMBODIMENTS FOR CARRYING OUT THE INVENTION

The present invention is described in more detail below.

The present invention has been made based on such a concept that an easy-bonding film having a good hydrolysis resistance may be produced by not only providing a polyester film as a base material which exhibits an excellent hydrolysis resistance even under high-temperature and high-humidity environmental conditions, but also simultaneously imparting a good hydrolysis resistance to a coating layer formed on the polyester film for improving an adhesion property thereof. When any of the polyester film as a base material and the coating layer formed thereon is deteriorated in hydrolysis resistance, the resulting easy-bonding film tends to be insufficient in hydrolysis resistance because it is more adversely influenced by the deteriorated one. Therefore, in order to obtain the polyester film having an excellent hydrolysis resistance as an easy-bonding film, it is inevitably required that both the base film and the coating layer have an excellent hydrolysis resistance. On the basis of this design concept, the polyester film as the base material and the coating layer into which the biaxially oriented polyester film of the present invention is generally divided, are explained in order below.

First, the polyester used as the base material of the film according to the present invention means such a polyester which may be obtained by polycondensing an aromatic dicarboxylic acid and an aliphatic glycol. Examples of the aromatic dicarboxylic acid include terephthalic acid, isophthalic acid and 2,6-naphthalenedicarboxylic acid. Examples of the aliphatic glycol include ethylene glycol, diethylene glycol and 1,4-cyclohexanedimethanol. Among these polyesters, polyethylene terephthalate (PET) is more excellent in balance between costs and properties. Therefore, in the present invention, a polyethylene terephthalate film is most preferably used as the polyester film.

The phosphorus element content in the polyester film of the present invention is required to be present within such a specific range as detected by the analysis using the below-mentioned fluorescent X-ray analyzer. The phosphorus element is usually derived from a phosphoric acid compound which is added as an optional component upon production of the polyester. In the present invention, it is required that the phosphorus element content in the polyester film lies within the range of 0 to 170 ppm. The phosphorus element content in the polyester film is preferably 50 to 170 ppm and more preferably 50 to 150 ppm. When satisfying the above-specified phosphorus element content in the polyester film, it is possible to impart a high hydrolysis resistance to the resulting polyester film. When the phosphorus element content in the polyester film is excessively large, the resulting polyester film tends to suffer from accelerated hydrolysis.

Examples of the phosphoric acid compound include known compounds such as phosphoric acid, phosphorous acid or esters thereof, phosphonic acid compounds, phosphinic acid compounds, phosphonous acid compounds and phosphinous acid compounds. Specific examples of the phosphoric acid compound include orthophosphoric acid, monomethyl phosphate, dimethyl phosphate, trimethyl phosphate, monoethyl phosphate, diethyl phosphate, triethyl phosphate, ethyl acid phosphate, monopropyl phosphate, dipropyl phosphate, tripropyl phosphate, monobutyl phosphate, dibutyl phosphate, tributyl phosphate, monoamyl phosphate, diamyl phosphate, triamyl phosphate, monohexyl phosphate, dihexyl phosphate and trihexyl phosphate.

The polyester used in the present invention may be produced in the presence of a metal compound polymerization catalyst generally often used in the polymerization for production of polyesters, which includes metals such as antimony, titanium and germanium. However, when the amount of the catalyst used is excessively large, the polyester tends to suffer from decomposition reaction upon melting the polyester to form a film therefrom, which tends to result in increased concentration of the terminal carboxylic acid in the polyester due to decrease in a molecular weight thereof. As a result, the polyester tends to be deteriorated in hydrolysis resistance. On the other hand, when the amount of the catalyst used is excessively small, the polymerization reaction rate tends to be lowered, so that the polymerization time tends to be prolonged, and the concentration of the terminal carboxylic acid in the polyester tends to become increased, resulting in deteriorated hydrolysis resistance of the resulting polyester. For this reason, in the present invention, the metal compound polymerization catalyst may be used in an amount of usually 50 to 400 ppm and preferably 100 to 350 ppm for the antimony compound catalyst, usually 1 to 20 ppm and preferably 2 to 15 ppm for the titanium compound catalyst, and usually 3 to 50 ppm and preferably 5 to 40 ppm for the germanium compound catalyst. These polymerization catalysts may be used in combination of any two or more thereof. For the same reasons, the content of the metal compound which may act as the catalyst for suppressing thermal decomposition or hydrolysis is preferably adjusted to as small a value as possible. On the other hand, for the purpose of enhancing a productivity of the film, metals such as magnesium, calcium, lithium and manganese may be incorporated in an amount of usually not more than 300 ppm and preferably not more than 250 ppm in the polyester to reduce a volume resistivity thereof upon melting. Meanwhile, the metal compound as used herein does not include the below-mentioned particles to be compounded in the polyester.

The film of the present invention may comprise particles for the purpose of mainly imparting an easy-slipping property thereto. The particles to be compounded in the film are not particularly limited, and any particles can be used as long as they are capable of imparting an easy-slipping property to the film. Specific examples of the particles include particles of silica, calcium carbonate, magnesium carbonate, barium carbonate, calcium sulfate, calcium phosphate, magnesium phosphate, silicon oxide, kaolin, aluminum oxide and the like. In addition, there may also be used refractory organic particles as described in Japanese Patent Publication (KOKOKU) No. 59-5216, Japanese Patent Application Laid-Open (KOKAI) No. 59-217755, etc. Examples of the other refractory organic particles include particles of thermosetting urea resins, thermosetting phenol resins, thermosetting epoxy resins, benzoguanamine resins or the like. Further, there may also be used deposited particles produced by precipitating or finely dispersing a part of the metal compounds such as the catalysts during production of the polyester.

On the other hand, the shape of the particles compounded in the film is not particularly limited, and may be any of a spherical shape, a massive shape, a bar shape, a flat shape, etc. Further, the hardness, specific gravity, color tone and the like of the particles are also not particularly limited. A series of these particles may be used in combination of any two or more thereof, if required.

Also, the average particle diameter of the particles used is preferably 0.01 to 10 µm. When the average particle diameter of the particles is less than 0.01 µm, the effect of imparting an easy-slipping property to the resulting film tends to be insufficient. On the other hand, when the average particle diameter of the particles is more than 10 µm, the resulting film tends to suffer from breakage upon production thereof, resulting in poor productivity of the film.

Further, the content of the particles in the polyester is usually in the range of 0.0003 to 1.0 part by weight and preferably 0.0005 to 0.5 part by weight based on the whole weight of the polyester constituting the film. When the content of the particles in the polyester is less than 0.0003 part by weight, the resulting film tends to be insufficient in easy-slipping property in some cases. On the other hand, when the content of the particles in the polyester is more than 1.0 part by weight, the resulting film tends to be considerably deteriorated in transparency as described hereinafter.

The method of adding the particles into the polyester is not particularly limited, and there may be used any conventionally known methods. For example, the particles may be added to the polyester at an optional stage during production of the polyester. In addition, the particles are preferably added at the esterification stage or after completion of the transesterification reaction, and thereafter the polycondensation reaction of the resulting polyester may proceed. Alternatively, there may be employed the method of blending a slurry prepared by dispersing the particles in ethylene glycol or water with the raw polyester material using a vented kneading extruder, or the method of blending the dried particles with the raw polyester material using a kneading extruder.

Meanwhile, in addition to the above particles, various conventionally known additives such as an antioxidant, a thermal stabilizer, a lubricant, an antistatic agent, a fluorescent brightener, a dye and a pigment may be added to the polyester film of the present invention. Also, for the purpose of enhancing a light resistance, an ultraviolet absorber may be added to the polyester film in an amount of 0.01 to 5 parts by weight based on the weight of the polyester. Examples of the ultraviolet absorber include triazine-based ultraviolet absorbers, benzophenone-based ultraviolet absorbers and benzoxazinone-based ultraviolet absorbers. Among these ultraviolet absorbers, the benzoxazinone-based ultraviolet absorbers are especially preferably used. In addition, in the case where the film has a laminated structure including three or more layers as described hereinlater, these ultraviolet absorbers may be suitably added to an intermediate layer thereof.

The thickness of the polyester film according to the present invention is not particularly limited as long as it lies within the range capable of forming a film shape, and is usually in the range of 20 to 250 µm and preferably 25 to 200 µm.

In the present invention, in order to control the terminal carboxylic acid content in the polyester film to the specific range, the content of the phosphoric acid compound in the polyester film is adjusted to the above-specified range, and at the same time, the residence time of the polyester in an extruder used in an extrusion step of polyester chips, for example, upon production of the film, is shortened. More specifically, the residence time from charging of the raw materials to initiation of discharge of a molten sheet is preferably not longer than 20 min and more preferably not longer than 15 min. In addition, a polyester having a low terminal carboxylic acid content may be used as the raw material and formed into a film shape to obtain the polyester film having a specific terminal carboxylic acid content which lies within the above-specified range. More specifically, the terminal carboxylic acid content in the raw polyester is preferably adjusted to not more than 20 equivalents/t and preferably not more than 15 equivalents/t in total. As the method of reducing the terminal carboxylic acid content in the polyester chips, there may be adopted conventionally known methods such as a method of enhancing a polymerization reaction efficiency, a method of increasing a polymerization rate, a method of suppressing a decomposition rate, and a method of using melt polymerization in combination with solid state polymerization. For example, these methods may be accomplished by a method of shortening a polymerization time, a method of increasing an amount of a polymerization catalyst used, a method of employing a high-activity polymerization catalyst, a method of lowering a polymerization temperature, etc. When using melt polymerization in combination with solid state polymerization, after completion of the melt polymerization, the resulting polyester may be formed into chips and then subjected to solid state polymerization while heating under reduced pressure or in a flow of an inert gas such as nitrogen in a temperature range of 180 to 240° C. The thus obtained polyester preferably has an intrinsic viscosity of not less than 0.55 dL/g and more preferably 0.60 to 0.90 dL/g. Further, if a reclaimed raw material obtained through a melting step is compounded to the above raw polyester upon production of the film, the terminal carboxylic acid content in the resulting polyester film tends to be increased. Therefore, in the present invention, none of such a reclaimed raw material is preferably compounded, and even if compounded, the reclaimed raw material is preferably added in an amount of not more than 20 parts by weight.

Next, the process for producing the polyester film according to the present invention is more specifically explained below. However, the following production process is only illustrative and not intended to limit the present invention thereto, and the other modification and changes are also possible as long as they can meet with the scope of the present invention.

That is, polyester chips which are dried by known methods or kept undried are fed to a kneading extruder and heated to a temperature not lower than a melting point of the respective polymers for melting the polyester chips. Then, the thus obtained molten polymers are extruded through a die onto a rotary cooling drum and rapidly cooled to a temperature not higher than a glass transition temperature thereof and solidified, thereby obtaining a substantially amorphous non-oriented sheet. In this case, in order to enhance a flatness or surface smoothness of the sheet, it is preferred to improve adhesion of the sheet to the rotary cooling drum. For this purpose, in the present invention, an electrostatic adhesion method and/or a liquid coating adhesion method are preferably used. Even in the melt-extrusion step, the terminal carboxylic acid content in the polyester film tends to be increased according to the conditions used. Therefore, in the present invention, there are preferably adopted a method of shortening a residence time of the polyester in the extruder during the extrusion step, a method of previously drying the raw material to a sufficient extent such that the water content therein is usually controlled to not more than 50 ppm and preferably not more than 30 ppm in the case of using a single-screw extruder, a method of providing a vent port on a twin-screw extruder so that the pressure of vent port is maintained under a reduced pressure of usually not more than 40 hPa, preferably not more than 30 hPa and more preferably not more than 20 hPa, etc.

In the present invention, the thus obtained sheet is biaxially stretched to form a film. More specifically, the stretching may be conducted under the following conditions. That is, the unstretched sheet is preferably stretched in a longitudinal direction thereof at a temperature of 70 to 145° C. and a stretch ratio of 2 to 6 times to form a longitudinally monoaxially stretched film, and then the monoaxially stretched film is stretched in a lateral direction thereof at a temperature of 90 to 160° C. and a stretch ratio of 2 to 6 times to form a biaxially stretched film. The resultant biaxially stretched film is preferably further heat-treated at a temperature of 160 to 220° C. for 1 to 600 sec.

Further, upon the heat treatment, in the maximum heat-treating temperature zone and/or a cooling zone located at an outlet of the heat treatment, the film is preferably subjected to relaxation by 0.1 to 20% in longitudinal and/or lateral directions thereof. In addition, if required, the thus obtained film may be subjected again to longitudinal and lateral re-stretching steps.

In the case where the below-mentioned coating layer is formed by an in-line coating method, it is preferred that after completion of the longitudinal stretching, the coating solution is applied onto the longitudinally stretched sheet and then dried, and the resulting coated sheet is subjected to lateral stretching.

In the present invention, as described above, using two or three or more melting extruders for polyesters, it is possible to produce a laminated film having two layers or three or more layers by a so-called co-extrusion method. As the layer structure, there may be mentioned a layer structure of A/B or A/B/A using a raw material A and a raw material B, a layer structure of A/B/C further using a raw material C, and the other layer structures.

In the thus produced film of the present invention, the polyester constituting the film has a terminal carboxylic acid content of not more than 26 equivalents/t and preferably not more than 24 equivalents/t. When the terminal carboxylic acid content in the polyester is more than 26 equivalents/t, the polyester tends to be deteriorated in hydrolysis resistance. On the other hand, in view of a high hydrolysis resistance required in the present invention, the lower limit of the terminal carboxylic acid content in the polyester is not particularly provided, and is usually about 10 equivalents/t from the viewpoints of a good polycondensation reaction efficiency, less occurrence of thermal decomposition in the melt-extrusion step, etc.

The hydrolysis resistance of the polyester film is a property giving an influence on a whole part of the film. In the present invention, in the case where the film having a laminated structure is produced by the co-extrusion method, it is required that the terminal carboxylic acid content in a whole of the polyester constituting the film lies within the above-specified range. Similarly, it is required that the content of phosphorus required as a catalyst in the present invention based on a whole amount of the polyester constituting the film also lies within the above-specified range.

Next, the coating layer provided in the film according to the present invention is explained.

It is required that the coating layer provided in the film of the present invention comprises a polyurethane having a polycarbonate skeleton or a polyether skeleton and a crosslinking agent in order to attain a good adhesion property to not only various solar cell sealing resins such as EVA, polyvinyl butyral (PVB), ethylene-methyl acrylate copolymers (EMA), ethylene-ethyl acrylate copolymers (EEA) and ethylene-α-olefin copolymers, but also various top-coating agents such as a hard coat, a prism layer and a diffusion layer without deterioration thereof due to hydrolysis.

The polyurethane having a polycarbonate skeleton or a polyether skeleton may be produced by using a compound having a polycarbonate skeleton or a polyether skeleton as a polyol. Meanwhile, the polyurethane may comprise both of a polycarbonate skeleton and a polyether skeleton at the same time.

The polycarbonate polyol used for production of the polyurethane constituting the coating layer may be obtained, for example, by reacting diphenyl carbonate, dialkyl carbonate, ethylene carbonate or phosgene with a diol, etc. Examples of the diol include ethylene glycol, 1,2-propylene glycol, 1,3-propylene glycol, 1,2-butanediol, 1,3-butanediol, 1,4-butanediol, 1,5-pentanediol, 1,6-hexanediol, 1,4-cyclohexanediol, 1,4-cyclohexane dimethanol, 1,7-heptanediol, 1,8-octanediol, 1,9-nonanediol, 1,10-decanediol, neopentyl glycol, 3-methyl-1,5-pentanediol and 3,3-dimethylol heptane. Among these diols, the polycarbonate polyols produced using 1,6-hexanediol are preferred from the viewpoints of a good industrial availability and enhanced adhesion property.

The polycarbonate polyols have a number-average molecular weight of 300 to 5000 in terms of polystyrene as measured by gel permeation chromatography (GPC).

Examples of the polyether polyol used for production of the polyurethane constituting the coating layer include polyoxyethylene polyols (such as polyethylene glycol), polyoxypropylene polyols (such as polypropylene glycol), polyoxybutylene polyols (such as polytetramethylene glycol), and copolymerized polyether polyols (such as block copolymers or random copolymers of polyoxyethylene glycol and polyoxypropylene glycol, etc.). Among these polyether polyols, polytetramethylene glycol is preferred from the viewpoint of enhanced adhesion property.

The polyether polyols have a number-average molecular weight of 300 to 5000 in terms of polyethylene glycol as measured by gel permeation chromatography (GPC).

The polyurethane produced by using the above polycarbonate polyols or polyether polyols are more excellent in hydrolysis resistance than those polyurethanes produced using polyester polyols as another generally used polyol.

These polycarbonate polyols or polyether polyols may be respectively used alone or in combination of any two or more thereof. The polycarbonate polyols and the polyether polyols may also be used in combination with each other.

As a polyisocyanate used for production of the polyurethane constituting the coating layer, there may be used conventionally known aliphatic alicyclic or aromatic polyisocyanates, etc.

Specific examples of the aliphatic polyisocyanates include tetramethylene diisocyanate, dodecamethylene diisocyanate, 1,4-butane diisocyanate, hexamethylene diisocyanate, 2,2,4-trimethylhexamethylene diisocyanate, 2,4,4-trimethylhexamethylene diisocyanate, 2-methyl pentane-1,5-diisocyanate, and 3-methyl pentane-1,5-diisocyanate.

Specific examples of the alicyclic polyisocyanates include isophorone diisocyanate, hydrogenated xylylene diisocyanate, hydrogenated diphenylmethane-4,4'-diisocyanate, hydrogenated biphenyl-4,4'-diisocyanate, 1,4-cyclohexane diisocyanate, hydrogenated tolylene diisocyanate, 1,3-bis(isocyanatomethyl)cyclohexane, and 1,4-bis(isocyanatomethyl)cyclohexane.

Specific examples of the aromatic polyisocyanates include tolylene diisocyanate, 2,2'-diphenylmethane diisocyanate, 2,4'-diphenylmethane diisocyanate, 4,4'-diphenylmethane diisocyanate, 4,4'-diphenyldimethylmethane diisocyanate, 4,4'-dibenzyl diisocyanate, 1,5-naphthylene diisocyanate, xylylene diisocyanate, 1,3-phenylene diisocyanate, and 1,4-phenylene diisocyanate.

Also, these polyisocyanates may be used alone or in combination of any two or more thereof.

Examples of the chain extender include ethylene glycol, propylene glycol, butanediol, diethylene glycol, trimethylol propane, hydrazine, ethylenediamine, diethylenetriamine, isophorone diamine, 4,4'-diaminodiphenylmethane, 4,4'-diaminodicyclohexylmethane and water.

The polyurethane having a polycarbonate structure or a polyether structure which is used in the coating layer in the present invention may be used in the form of a dispersion or solution prepared using an organic solvent as a medium therefor. However, the polyurethane is preferably used in the form of a dispersion or solution prepared using water as the medium. As the polyurethane in the form of a dispersion or solution in water, there may be used a forced emulsification-type polyurethane prepared using an emulsifier, a self-emulsifiable type or a water-soluble type polyurethane prepared by introducing a hydrophilic group into a polyurethane resin, or the like. In particular, the self-emulsifiable type polyurethane prepared by introducing an ionic group into a skeleton of the polyurethane resin for forming an ionomer thereof is preferably used because it is excellent in liquid storage stability and in water resistance, transparency and adhesion property of the resulting coating layer.

In addition, examples of an anionic group as the ionic group to be introduced into the skeleton of the polyurethane resin include a carboxylate group, a sulfonate group, a phosphate group and a phosphonate group. Examples of a cationic group as the ionic group include a quaternary ammonium group, etc. Specific examples of the carboxylate group as the anionic group include ammonium salts or lower amine salts of dimethylol propionic acid, dimethylol butanoic acid, bis-(2-hydroxyethyl)propionic acid, bis-(2-hydroxyethyl)butanoic acid, trimellitic acid bis(ethylene glycol) ester, etc. As the quaternary ammonium group as the cationic group, there may be suitably used quaternarized products of N-alkyl dialkanol amines such as N-methyl diethanol amine and N-ethyl diethanol amine, etc. Among these ionic groups, especially preferred are carboxylate groups whose counter ion is an organic amine having a boiling point of not higher than 150° C. such as ammonia and triethyl amine, from the viewpoints of a high reactivity with the below-mentioned oxazoline-based crosslinking agent or carbodiimide-based crosslinking agent and an enhanced crosslink density of the resulting coating layer.

As the method of introducing the ionic group into the urethane resin, there may be used various methods which may be conducted at the respective stages of the polymerization reaction. For example, there may be used the method in which a resin having an ionic group is used as a comonomer component upon synthesis of a prepolymer, the method in which a component having an ionic group is used as one of components such as a polyol, a chain extender and the like.

In the coating layer provided in the film of the present invention, it is required that a crosslinking agent is used in combination with the above polyurethane for the purpose of imparting a heat resistance, a heat-resistant adhesion property, a moisture resistance and an anti-blocking property to the resulting coating layer. The crosslinking agent is preferably either water-soluble or water-dispersible. More specifically, it is required that the coating layer comprises at least one compound selected from the group consisting of methylolated or alkoxymethylolated melamine-based compounds, benzoguanamine-based compounds, urea-based compounds, acrylamide-based compounds, epoxy-based compounds, isocyanate-based compounds, carbodiimide-based compounds, oxazoline-based compounds, silane coupling agent-based compounds and titanium coupling agent-based compounds. Among these crosslinking agents, especially preferred are oxazoline-based compounds and carbodiimide-based compounds because they are in the form of a polymer by themselves and therefore capable of considerably enhancing a heat-resistant adhesion property and moisture resistance of the coating layer. Examples of such an oxazoline-based crosslinking agent include industrially available products such as "EPOCROSS (registered trademark)" (tradename) produced by Nippon Shokubai Co., Ltd. Examples of such a carbodiimide-based crosslinking agent include industrially available products such as "CARBODILITE (registered trademark)" (tradename) produced by Nisshinbo Chemical Inc. The crosslinking agent may be added in such an amount that the weight ratio of the crosslinking agent to the polyurethane in the coating layer is 10:90 to 90:10 and preferably 20:80 to 80:20.

In the coating layer provided in the film of the present invention, the total amount of the above-mentioned polyurethane and crosslinking agent components is preferably not less than 50% by weight and more preferably not less than 75% by weight. In addition to these resin components, the other additional resins may be further added to the coating layer. Examples of the other additional resins added to the coating layer include polyester-based resins, acryl-based resins, polyvinyl-based resins and polyester polyurethane resins. However, the polyester-based resins and the polyester polyurethane resins tend to be deteriorated in hydrolysis resistance. Therefore, none of these resins are added to the coating layer, or if added, the amount of the resins added is preferably controlled to less than 10% by weight.

Further, in the present invention, in order to prevent occurrence of blocking in the coating layer and imparting a slip property to the coating layer, it is possible to add fine particles to the coating layer. Examples of the fine particles include inorganic particles such as silica, alumina and metal oxides, and organic particles such as crosslinked polymer particles. The particle size of the fine particles is not more than 150 nm and preferably not more than 100 nm, and the amount of the fine particles added to the coating layer is preferably selected from the range of 0.5 to 10% by weight.

In addition to the above components, the coating layer may also comprise the other components, if required. Examples of the other components include surfactants, defoaming agents, coatability improvers, thickening agents, antioxidants, antistatic agents, ultraviolet absorbers, foaming agents, dyes and pigments. These additives may be used alone or in combination of any two or more thereof.

As described above, the coating layer provided in the film of the present invention may be formed by applying a coating solution prepared using water as a main medium onto a polyester film. The polyester film to which the coating solution is to be applied may be previously biaxially stretched. However, there is preferably used a so-called in-line coating method in which the polyester film is preferably stretched in at least one direction after applying the coating solution thereto, and then heat-set. According to the in-line coating method, the polyester film and the coating layer can be heat-set at an elevated temperature usually as high as not lower than 200° C. at the same time, so that the heat crosslinking reaction of the coating layer is allowed to proceed sufficiently, and the adhesion between the coating layer and the polyester film can be enhanced.

In addition, the coating solution may comprise, in addition to water, one or more organic solvents having a compatibility with water in an amount of usually not more than 20% by weight for the purposes of enhancing a dispersibility and a storage stability thereof as well as improving a coatability thereof and properties of the resulting coating layer.

As the method of applying the coating solution onto the polyester film as the base material, there may be used optional conventionally known coating methods. Specific examples of the coating methods include a roll coating method, a gravure coating method, a micro-gravure coating method, a reverse coating method, a bar coating method, a roll brush coating method, a spray coating method, an air knife coating method, an impregnation coating method, a curtain coating method and a die coating method. These coating methods may be used alone or in combination of any two or more thereof.

The coating amount of the coating layer as a dried film finally obtained after drying and solidification or after subjected to biaxial stretching and heat-setting, etc., is preferably in the range of 0.005 to 1.0 g/m$^2$ and more preferably 0.01 to 0.5 g/m$^2$. When the coating amount is less than 0.005 g/m$^2$, the resulting coating layer tends to be insufficient in adhesion property. When the coating amount is more than 1.0 g/m$^2$, the effect of enhancing the adhesion property of the coating layer is already saturated, and on the contrary, the resulting film rather tends to suffer from drawbacks such as blocking.

In the present invention, the coating layer may be provided on only one surface of the polyester film or may be provided on both surfaces thereof. In addition, the above coating layer may be provided on one surface of the polyester film, and another coating layer may be provided on the opposite surface of the polyester film.

The biaxially oriented polyester film according to the present invention which is provided thereon with the above coating layer is required to have a haze value of not more than 10%, preferably not more than 8% and more preferably not more than 5%. The lower limit of the haze value of the biaxially oriented polyester film is not particularly limited, and is usually about 0.3%.

In order to reduce the haze value of the biaxially oriented polyester film to not more than 10%, the size and amount of the particles to be added to the polyester film as the base material or the size and amount of the fine particles to be added to the coating layer may be suitably controlled. In this case, the specific amount of the particles or fine particles to be added is preferably controlled such that the amount of the particles added to the polyester film is not more than 1% by weight, and the amount of the fine particles added to the coating layer is not more than 10% by weight.

As described above, in the easy-bonding biaxially oriented polyester film according to the present invention, the polyester film as the base material has an excellent hydrolysis resistance even under high-temperature and high-humidity environmental conditions, and at the same time, the coating layer formed on the polyester film for improving an adhesion property of the film also has a good hydrolysis resistance. Therefore, the resulting biaxially oriented polyester film may be suitably used as a film for a protective member for protecting a back surface of solar cells. In addition, the film of the present invention may also be used on a front side of the solar cells in place of a glass material. Besides, the biaxially oriented polyester film may be used, for example, as a film for display members such as a touch panel used under high-temperature and high-humidity environmental conditions or a liquid crystal display for vehicles. In order to use the film in these applications, it is required that the film has a light transmitting property. Thus, the easy-bonding biaxially oriented polyester film of the present invention is required to have a haze value of not more than 10%.

EXAMPLES

The present invention is described in more detail below by the following Examples and Comparative Examples. However, these Examples are only illustrative and not intended to limit the present invention thereto, and other variations and modifications are possible unless they depart from the scope of the present invention. Meanwhile, the methods for measuring and evaluating various properties of the film are as follows.

(1) Terminal Carboxylic Acid Content (Equivalent/t):

The terminal carboxylic acid content was measured by a so-called titration method. More specifically, a phenol red indicator was added to a solution prepared by dissolving the polyester in benzyl alcohol, and the resulting solution was titrated with a water/methanol/benzyl alcohol solution of sodium hydroxide. When the film was provided with a coating layer, in order to eliminate adverse influence of the coating layer on the measurement, the coating layer was washed out and removed using an abrasive-containing cleanser. Thereafter, the thus treated film was sufficiently rinsed with ion-exchanged water, dried, and then subjected to the same measurement as described above.

(2) Film Haze:

The haze of the film was measured using an integrating sphere type turbidity meter "NDH2000" manufactured by Nippon Denshoku Industries Co., Ltd., according to JIS K 7136 (2000).

(3) Quantitative Determination of Elements Derived from Catalyst:

Using a fluorescent X-ray analyzer "Model No.: XRF-1500" manufactured by Shimadzu Corp., the amounts of respective elements in the film were determined by conducting a single sheet measurement thereof by FP method under the following conditions as shown in Table 1. If the film to be measured was in the form of a laminated film, the laminated film was melted and then molded into a disk shape, and the disk-shaped molded product was subjected to the measurement of contents of the elements based on the whole film. Further, when the film was provided with a coating layer, in order to eliminate adverse influence of the coating layer on the measurement, the coating layer was washed out and removed using an abrasive-containing cleanser. Thereafter, the thus treated film was sufficiently rinsed with ion-exchanged water, dried, and then subjected to the same measurement as described above. Meanwhile, in the above method, the detection limit was usually about 1 ppm.

TABLE 1

|  | Sb | Ge | Ti | P |
|---|---|---|---|---|
| X-ray tube target | Rh4.0 kW | Rh4.0 kW | Rh4.0 kW | Rh4.0 kW |
| Voltage (kV) | 40 | 40 | 40 | 40 |
| Current (mA) | 95 | 95 | 95 | 95 |
| Analyzing crystal | LiF | LiF | LiF | Ge |
| Detector | FPC | SC | SC | FPC |
| 2θ (deg) | 117.34 | 36.33 | 86.14 | 141.03 |
| Measuring time (sec) two-point background; 20 sec for each | 40.0 | 40.0 | 40.0 | 40.0 |

(4) Intrinsic Viscosity:

One gram of a sample to be measured was accurately weighed, and dissolved in a mixed solvent comprising phenol and tetrachloroethane at mixing ratio (phenol/tetrachloroethane) of 50/50 (parts by weight) to prepare a solution having a concentration (c) of 0.01 g/cm$^3$. The relative viscosity $\eta r$ of the thus prepared solution relative to the solvent was measured at 30° C. to thereby determine an intrinsic viscosity [η] thereof.

(5) Hydrolysis Resistance Based on Elongation at Break of Film:

Using a personal pressure cracker "PC-242HS-E" manufactured by Hirayama Manufacturing Corp., the film was treated in an atmosphere of 120° C. and 100% RH for 35 hr. Next, after the film was conditioned at 23° C. and 50% RH for 24 hr, the elongation at break of the film in a film-forming direction (MD direction) as mechanical properties thereof was measured. The measurement of the elongation at break of the film was conducted using a universal tester "AUTOGRAPH" manufactured by Shimadzu Corp., under the conditions that the width of the sample was 15 mm; a distance between chucks was 50 mm; and a pulling speed was 200 mm/min. The retention rates (%) of the elongation at break before and after the above treatment were respectively calculated from the following formula (1), and the hydrolysis resistance of the film was evaluated according to the following ratings.

Retention rate of elongation at break=(elongation at break after treatment)÷(elongation at break before treatment)×100    (1)

A: The retention rate was not less than 80%;
B: The retention rate was not less than 60% and less than 80%;
C: The retention rate was not less than 30% and less than 60%; and
D: The retention rate was less than 30%.

(6) Adhesion Strength to EVA:

A polyester film was cut into two small pieces each having a length of 300 mm and a width of 25 mm such that the longitudinal direction of each small piece was aligned with the MD direction. On the other hand, an EVA film was cut into a small piece having a length of 50 mm and a width of 25 mm, and the small piece of the EVA film was interposed between the two small pieces of the polyester film such that a coating layer of each small piece of the polyester film faced to the small piece of the EVA film. The thus overlapped film pieces were laminated using a heat sealer device "TP-701-B" manufactured by Tester Sangyo Co., Ltd. The EVA film used in the above measurement was "485.00" (standard cured type; thickness: 0.5 mm) produced by Etimex GmbH, Germany, and the heat sealing procedure were conducted at a temperature of 150° C. under a pressure of 0.13 MPa for 20 min.

In order to measure an adhesion strength of the polyester film to EVA, the 25 mm-width small piece of the polyester/EVA laminated film was cut into a sample having a length of 300 mm and a width of 15 mm. The obtained sample was fitted to a tensile/bending tester "EZ Graph" manufactured by Shimadzu Corp., at end portions thereof where each polyester film small piece having a width of 15 mm was not laminated with the EVA film small piece. Successively, the polyester/EVA laminated film sample was separated into the respective film pieces at a peel angle of 180° and a peel speed of 100 m/sec to measure a force (adhesion strength) required for separating the respective film pieces of the polyester/EVA laminated film from each other. The measurement was conducted with respect to 10 samples, and the measurement results were classified into the following ratings on the basis of an average value of the measured adhesion strength values.

A: The adhesion strength was not less than 50 N/15 mm in width;
B: The adhesion strength was not less than 30 N/15 mm in width and less than 50 N/15 mm in width;
C: The adhesion strength was not less than 10 N/15 mm in width and less than 30 N/15 mm in width; and D: The adhesion strength was less than 10 N/15 mm in width.

(7) Hydrolysis Resistance Based on Adhesion Strength to EVA:

The 25 mm-width test piece of the polyester/EVA laminated film prepared in the above (6) was subjected to wet heat treatment in an atmosphere of 120° C. and 100% RH for 35 hr in the same manner as defined in the above (5). Next, the sample was conditioned at 23° C. and 50% RH for 24 hr, and then cut into a measuring sample piece having a width of 15 mm. The measuring sample piece was subjected to the same measurement as defined in the above (6) to determine an average value of the force (adhesion strength) required for separating the polyester/EVA laminated film into the respective film pieces. From the thus obtained average value of the adhesion strengths and that of adhesion strengths before subjected to the wet heat treatment, the retention rate of the adhesion strength was calculated according to the following formula, and evaluated by the following ratings.

Retention rate (%) of adhesion strength=(adhesion strength after wet heat treatment)/(adhesion strength before wet heat treatment)

A: The retention rate was not less than 70%;
B: The retention rate was not less than 50% and less than 70%;
C: The retention rate was less than 50%; and
D: The polyester film itself was considerably deteriorated, and suffered from breakage or damage.

(8) Adhesion Property to Hard Coat Layer:

A UV-curable type urethane acrylate-based hard coat agent "SHIKO (registered trademark)" (tradename) produced by Nippon Synthetic Chemical Industry Co., Ltd., was applied onto a surface of the coating layer provided in the polyester film, and then dried at 80° C. for 1 min to remove a solvent therefrom. Next, while traveling the film at a velocity of 10 m/min, an ultraviolet ray was irradiated thereto at an irradiation energy of 120 W/cm from a position apart by 10 cm therefrom using a mercury lamp to thereby obtain the polyester film having a 5 μm-thick hard coat layer.

The surface of the hard coat layer thus formed on the coating layer in the polyester film was subjected to crosscutting to form 100 square cross-cuts each having an area of 1 $mm^2$ thereon. A 18 mm-wide tape ("Cellotape (registered trademark) CT-18" produced by Nichiban Co., Ltd.) was attached onto the cross-cut hard coat layer, and then rapidly peeled off therefrom at a peel angle of 180°. Then, the surface of the hard coat layer from which the tape was peeled off was observed to measure an area of the hard coat layer peeled off. The evaluation ratings are as follows.

A: Peeled area of the hard coat layer was less than 5%;
B: Peeled area of the hard coat layer was not less than 5% and less than 20%;
C: Peeled area of the hard coat layer was not less than 20% and less than 50%;
D: Peeled area of the hard coat layer was not less than 50%; and
E: The polyester film itself was considerably deteriorated, and suffered from breakage or damage.

(9) Hydrolysis Resistance Based on Adhesion Property to Hard Coat Layer:

The film having the hard coat layer thereon prepared in the above (8) was treated in an atmosphere of 120° C. and 100% RH for 35 hr in the same manner as defined in the above (5). Next, the thus treated film was conditioned at 23° C. and 50% RH for 24 hr, and then subjected to peel test in the same manner as defined in the above (8) to compare the adhesion properties based on the same ratings.

(10) Adhesion Property to Polyvinyl Butyral (PVB):

Preparation of PVB Sheet for Evaluation

Six parts by weight of powdery PVB (molecular weight: about 110,000; butyralization degree: 65 mol %; hydroxyl group content: about 34 mol %) and 4 parts by weight of tri(ethylene glycol)-bis-2-ethyl hexanoate (as a plasticizer) were mixed and swelled with 45 parts by weight of toluene, and then 45 parts by weight of ethanol were added to the resulting mixture to dissolve PVB therein. The obtained PVB solution was filled in a Teflon (registered trademark) petri dish until reaching a depth of 4 mm, and dried in a hot air oven at 100° C. for 1 hr to thereby obtain a PVB sheet having a thickness of about 0.4 mm.

Evaluation for Adhesion Property

The thus obtained PVB sheet was cut into a sheet piece having a width of 1 cm and a length of 10 cm. The thus cut sheet piece was sandwiched between two films to be tested such that an easy-bonding surface of the respective films faced to the PVB sheet piece, and thermocompression-bonded together using a heat seal tester "TP-701" manufactured by Tester Sangyo Co., Ltd. The testing conditions used above were as follows.

Pressure: 0.13 MPa
Temperature: 140° C.
Time: 3 min

The thus thermocompression-bonded laminated film was allowed to stand for cooling over day and night, and the thermocompression-bonded portions were peeled off by hands to evaluate an adhesion property thereof according to the following ratings.

A: Good adhesion strength (testing films or PVB sheet were damaged, or a strong peeling force was required for peeling them at a bonding boundary therebetween);
B: Normal adhesion strength (peeled at the bonding boundary with a feel of a light resisting force);
C: Poor adhesion strength (readily peeled at the bonding boundary with substantially no feel of a resisting force); and
D: The polyester film itself was considerably deteriorated, and suffered from breakage or damage.

(11) Hydrolysis Resistance Based on Adhesion Property to PVB:

The test sample for evaluation of adhesion property prepared in the above (10) was subjected to wet heat treatment under the conditions of 85° C. and 85% RH for 500 hr using a thermo-hygrostat "PR-2KP" manufactured by ESPEC Corp. The thus treated sample was withdrawn from the thermo-hygrostat and allowed to stand for cooling over day and night, and thereafter subjected to evaluation for an adhesion property thereof in the same manner as defined in the above (10).

Next, the polyester raw materials used in the following Examples and Comparative Examples are explained.

<Method for Production of Polyester (1)>

A reaction vessel was charged with 100 parts by weight of dimethyl terephthalate and 60 parts by weight of ethylene glycol as starting materials as well as 0.09 part by weight of calcium acetate as a catalyst, and the reaction temperature in the reaction vessel was gradually raised from 150° C. as a reaction initiation temperature while distilling off methanol as produced until reaching 230° C. after 3 hr. After the elapse of 4 hr, the transesterification reaction was substantially terminated. The resulting reaction mixture was mixed with 0.035 part by weight of antimony trioxide and 0.08 part by weight of silica particles having an average particle diameter of 2.6 μm in the form of a dispersion in ethylene glycol, and the resulting mixture was subjected to polycondensation reaction for 4 hr. That is, in the above polycondensation reaction, the reaction temperature was gradually raised from 230° C. and finally allowed to reach 280° C. On the other hand, the reaction pressure was gradually dropped from normal pressures and finally allowed to reach 40 Pa. After initiation of the reaction, the change in agitation power in the reaction vessel was monitored, and the reaction was terminated at the time at which the agitation power reached the value corresponding to an intrinsic viscosity of 0.60. The resulting polymer was withdrawn from the reaction vessel under application of a nitrogen pressure. As a result, it was confirmed that the thus obtained polyester (1) had an intrinsic viscosity of 0.60, and the terminal carboxylic acid content of the polymer was 35 equivalents/t.

<Method for Production of Polyester (2)>

The polyester (1) as a starting material was subjected to solid state polymerization at 220° C. in vacuo to thereby obtain a polyester (2). As a result, it was confirmed that the thus obtained polyester (2) had an intrinsic viscosity of 0.74, and the terminal carboxylic acid content of the polymer was 9 equivalents/t.

<Method for Production of Polyester (3)>

The same procedure as defined in the above method for production of the polyester (1) was conducted except that after completion of the transesterification reaction, 0.063 part by weight of orthophosphoric acid (0.02 part by weight in terms of phosphorus element) was added to the reaction solution, and then 0.035 part by weight of antimony trioxide and 0.08 part by weight of silica particles having an average particle diameter of 2.6 μm in the form of a dispersion in ethylene glycol were added thereto, thereby obtain a polyester (3). As a result, it was confirmed that the thus obtained polyester (3) had an intrinsic viscosity of 0.63, and the terminal carboxylic acid content of the polymer was 14 equivalents/t.

<Method for Production of Polyester (4)>

The polyester (3) as a starting material was subjected to solid state polymerization at 220° C. in vacuo to thereby obtain a polyester (4). As a result, it was confirmed that the thus obtained polyester (4) had an intrinsic viscosity of 0.69, and the terminal carboxylic acid content of the polymer was 12 equivalents/t.

<Coating Agents and Formulation of Coating Agents>

The formulation of the coating agents in the coating layer are shown in Table 2 below. Meanwhile, the amounts of the respective components added as shown in Table 2 all represent "% by weight" in terms of a solid content. The coating agents used were as follows.

U1: A water dispersion of a polyurethane produced from polytetramethylene glycol having a number-average molecular weight of about 1000, dimethylol propionic acid and isophorone diisocyanate (counter ion of carboxylic acid: ammonia)

U2: A water dispersion of a polyurethane produced from a polycarbonate polyol of hexamethylene diol (having a number-average molecular weight of about 1000), dimethylol propionic acid and hydrogenated diphenyl methane-4,4'-diisocyanate (counter ion of carboxylic acid: triethylamine)

U3: "HYDRAN (registered trademark) AP-40F" (tradename) produced by DIC Corp., as a water dispersion of a polyester polyurethane produced from an aromatic polyester and an aliphatic diisocyanate E1: "FINETEC (registered trademark) ES-670" (tradename) produced by DIC Corp., as a water dispersion of an aromatic polyester X1: "EPOCROSS (registered trademark) WS-500" (tradename) produced by Nippon Shokubai Co., Ltd., as an oxazoline-based water-soluble resin crosslinking agent X2: "CARBODILITE (registered trademark) V-02-L2" (tradename) produced by Nisshinbo Chemical Inc., as a carbodiimide-based water-soluble resin crosslinking agent X3: "DENACOL (registered trademark) EX-521" (tradename) produced by Nagase Chemtex Co., Ltd., as a water-soluble epoxy-based crosslinking agent D1: A water dispersion of silica fine particles (average particle diameter: 60 nm)

TABLE 2

|  | Polyurethane | | Other resins | |
| --- | --- | --- | --- | --- |
|  | Kind | Amount added (%) | Kind | Amount added (%) |
| Coating agent 1 | U-1 | 40 | — | — |
| Coating agent 2 | U-1 | 40 | — | — |
| Coating agent 3 | U-2 | 40 | — | — |
| Coating agent 4 | U-2 | 40 | — | — |
| Coating agent 5 | U-3 | 40 | — | — |
| Coating agent 6 | U-3 | 40 | — | — |
| Coating agent 7 | U-2 | 40 | — | — |
| Coating agent 8 | U-1 | 95 | — | — |
| Coating agent 9 | — | — | — | — |
| Coating agent 10 | — | — | E-1 | 40 |

|  | Crosslinking agent | | Fine particles | |
| --- | --- | --- | --- | --- |
|  | Kind | Amount added (%) | Kind | Amount added (%) |
| Coating agent 1 | X-1 | 55 | D-1 | 5 |
| Coating agent 2 | X-2 | 55 | D-1 | 5 |
| Coating agent 3 | X-1 | 55 | D-1 | 5 |
| Coating agent 4 | X-2 | 55 | D-1 | 5 |
| Coating agent 5 | X-1 | 55 | D-1 | 5 |
| Coating agent 6 | X-2 | 55 | D-1 | 5 |
| Coating agent 7 | X-3 | 55 | D-1 | 5 |
| Coating agent 8 | — | — | D-1 | 5 |
| Coating agent 9 | X-2 | 95 | D-1 | 5 |
| Coating agent 10 | X-1 | 55 | D-1 | 5 |

Example 1

The above polyester (2) and polyester (4) were mixed with each other at a mixing ratio of 4:6 to obtain a polyester mixture as a raw material. The resulting polyester mixture was melted and extruded at 290° C. from a vented twin-screw extruder onto a casting drum whose surface temperature was maintained at 40° C. to rapidly cool and solidify the mixture by an electrostatic adhesion method, thereby forming an unstretched sheet. The retention time of the above melting and extruding procedure was 14 min. The thus obtained sheet was stretched at 85° C. at a stretch ratio of 3.6 times in a longitudinal direction thereof by a roll stretching method. At this time, one surface of the thus obtained monoaxially stretched sheet was subjected to corona discharge treatment, and then the coating agent 1 as shown in Table 2 above was applied onto the thus treated surface of the sheet using a bar coater such that the coating amount of the coating agent 1 on the finally obtained film was 0.02 g/m². Next, the resulting coated sheet was introduced into a tenter, and dried therein at 100° C. and then stretched at 110° C. at a stretch ratio of 3.9 times in a lateral direction thereof. The thus biaxially stretched sheet was further subjected to heat treatment at 220° C. and contracted by 4% at 200° C. in a width direction thereof, thereby obtaining a film having a thickness of 50 μm. The properties and evaluation results of the thus obtained film are shown in Table 3 below.

Example 2

The same procedure as defined in Example 1 was conducted except that the raw material was replaced with a polyester mixture prepared by mixing the above polyester (2) and polyester (3) with each other at a mixing ratio of 8:2, thereby obtaining a film. The properties and evaluation results of the thus obtained film are shown in Table 3 below.

Example 3

The same procedure as defined in Example 1 was conducted except that the raw material was replaced with a polyester mixture prepared by mixing the above polyester (1), polyester (2) and polyester (4) with each other at a mixing ratio of 2:1:7, thereby obtaining a film. The properties and evaluation results of the thus obtained film are shown in Table 3 below.

Example 4

The same procedure as defined in Example 1 was conducted except that the raw material was replaced with the above polyester (2) solely, thereby obtaining a film. The properties and evaluation results of the thus obtained film are shown in Table 3 below.

Comparative Example 1

The same procedure as defined in Example 1 was conducted except that the raw material was replaced with a polyester mixture prepared by mixing the above polyester (1) and polyester (4) with each other at a mixing ratio of 1:9, thereby obtaining a film. The properties and evaluation results of the thus obtained film are shown in Table 3 below.

Comparative Example 2

The same procedure as defined in Example 1 was conducted except that the raw material was replaced with a polyester mixture prepared by mixing the above polyester (1) and polyester (3) with each other at a mixing ratio of 4:6, thereby obtaining a film. The properties and evaluation results of the thus obtained film are shown in Table 3 below.

Comparative Example 3

The same procedure as defined in Example 1 was conducted except that the raw material was replaced with the above polyester (4) solely, thereby obtaining a film. The properties and evaluation results of the thus obtained film are shown in Table 3 below.

Comparative Example 4

The same procedure as defined in Example 1 was conducted except that the raw material was replaced with a polyester mixture prepared by mixing the above polyester (1) and polyester (3) with each other at a mixing ratio of 5:5, thereby obtaining a film. The properties and evaluation results of the thus obtained film are shown in Table 3 below.

Examples 5 to 8 and Comparative Examples 5 to 9

The same procedure as defined in Example 1 was conducted except that the coating agents used in the coating layer were replaced with the coating agents 2 to 10 shown in Table 2, thereby obtaining films. The properties and evaluation results of the thus obtained films are shown in Table 4 below.

TABLE 3

|  | Examples | | | |
|---|---|---|---|---|
|  | 1 | 2 | 3 | 4 |
| Terminal carboxylic acid content (equivalent/t) | 21 | 23 | 21 | 22 |
| Catalyst amount (ppm) | | | | |
| P | 120 | 40 | 140 | 0 |
| Sb | 334 | 334 | 334 | 334 |
| Haze of film (%) | 3.5 | 1.1 | 4.6 | 0.5 |
| Hydrolysis resistance based on elongation at break of film | A | A | B | B |
| Kind of coating layer | 1 | 1 | 1 | 1 |
| Adhesion strength to EVA | A | A | A | A |
| Hydrolysis resistance based on adhesion strength to EVA | A | A | B | B |
| Adhesion property to hard coat layer | A | A | A | A |
| Hydrolysis resistance based on adhesion property to hard coat layer | B | B | B | B |
| Adhesion property to PVB | A | A | A | A |
| Hydrolysis resistance based on adhesion property to PVB | A | A | A | A |

|  | Comparative Examples | | | |
|---|---|---|---|---|
|  | 1 | 2 | 3 | 4 |
| Terminal carboxylic acid content (equivalent/t) | 24 | 28 | 22 | 30 |
| Catalyst amount (ppm) | | | | |
| P | 180 | 120 | 200 | 100 |
| Sb | 334 | 334 | 334 | 334 |
| Haze of film (%) | 5.7 | 3.5 | 6.3 | 2.8 |
| Hydrolysis resistance based on elongation at break of film | C | C | D | D |
| Kind of coating layer | 1 | 1 | 1 | 1 |
| Adhesion strength to EVA | A | A | A | A |
| Hydrolysis resistance based on adhesion strength to EVA | C | C | D | D |
| Adhesion property to hard coat layer | A | A | A | A |
| Hydrolysis resistance based on adhesion property to hard coat layer | D | D | E | E |
| Adhesion property to PVB | A | A | A | A |
| Hydrolysis resistance based on adhesion property to PVB | B | B | D | D |

TABLE 4

|  | Examples | | | |
|---|---|---|---|---|
|  | 5 | 6 | 7 | 8 |
| Terminal carboxylic acid content (equivalent/t) | 21 | 21 | 21 | 21 |
| Catalyst amount (ppm) | | | | |
| P | 120 | 120 | 120 | 120 |
| Sb | 334 | 334 | 334 | 334 |
| Haze of film (%) | 3.0 | 3.0 | 3.0 | 3.0 |
| Hydrolysis resistance based on elongation at break of film | A | A | A | A |
| Kind of coating layer | 2 | 3 | 4 | 7 |
| Adhesion strength to EVA | A | A | A | B |
| Hydrolysis resistance based on adhesion strength to EVA | A | A | A | B |
| Adhesion property to hard coat layer | A | A | A | A |

TABLE 4-continued

| | | | | |
|---|---|---|---|---|
| Hydrolysis resistance based on adhesion property to hard coat layer | B | B | B | C |
| Adhesion property to PVB | A | A | A | A |
| Hydrolysis resistance based on adhesion property to PVB | A | A | A | A |

| | Comparative Examples | | | | |
|---|---|---|---|---|---|
| | 5 | 6 | 7 | 8 | 9 |
| Terminal carboxylic acid content (equivalent/t) | 21 | 21 | 21 | 21 | 21 |
| Catalyst amount (ppm) | | | | | |
| P | 120 | 120 | 120 | 120 | 120 |
| Sb | 334 | 334 | 334 | 334 | 334 |
| Haze of film (%) | 3.0 | 3.0 | 3.0 | 3.0 | 3.0 |
| Hydrolysis resistance based on elongation at break of film | A | A | A | A | A |
| Kind of coating layer | 5 | 6 | 8 | 9 | 10 |
| Adhesion strength to EVA | B | B | B | D | B |
| Hydrolysis resistance based on adhesion strength to EVA | C | C | C | C | C |
| Adhesion property to hard coat layer | A | A | A | D | A |
| Hydrolysis resistance based on adhesion property to hard coat layer | D | D | D | D | D |
| Adhesion property to PVB | A | A | A | C | A |
| Hydrolysis resistance based on adhesion property to PVB | C | C | C | C | C |

INDUSTRIAL APPLICABILITY

The film of the present invention can be suitably used, for example, in the applications such as a film for a protective member for protecting a back surface of solar cells.

The invention claimed is:

1. A biaxially oriented polyester film in the form of a laminated film comprising;
   a biaxially oriented polyester base film having a phosphorus element content of 0 to 170 ppm and a terminal carboxylic acid content of not more than 26 equivalents/t, and
   a coating layer formed on at least one surface of the biaxially oriented polyester base film which comprises a polyurethane having a polycarbonate skeleton or a polyether skeleton and a crosslinking agent,
   wherein the laminated film has a haze value of not more than 10%, wherein the coating layer comprises no polyester-based. resin and polyester polyurethane resin, or the coating layer comprises a polyester-based. resin and polyester polyurethane resin in the amount of less than 10% by weight based on the weight of coating layer,
   the laminated film further comprising a solar cell sealing resin layer directly laminated on the coating layer, which solar cell sealing resin layer comprises at least one member selected from the group consisting of ethyiene-vinyl acetate copolymer, polyvinyl butyral, ethylene-methyl acrylate copolymers, ethylene-ethyl acrylate copolymers and ethylene-α-olefin copolymers.

2. The biaxially oriented polyester film according to claim 1, wherein the crosslinking agent is a polymer having an oxazoline group or a carbodiimide group.

3. The biaxially oriented polyester film according to claim 1, wherein a total amount of the polyurethane and the crosslinking agent in the coating layer is not less than 50% by weight, and a weight ratio of the polyurethane to the crosslinking agent is 10:90 to 90:10.

4. The biaxially oriented polyester film according to claim 1, wherein the biaxially oriented polyester film is produced by using a polyester obtained by solid-state polymerization as a part or whole of a raw material therefor.

5. The biaxially oriented polyester film according to claim 1, wherein the coating layer comprises a polyurethane having a polyether skeleton and a crosslinking agent,
   wherein the coating layer comprises no resin other than the polyurethane having the polyether skeleton, or the coating layer comprises a resin other than the polyurethane having the polyether skeleton in the amount of less than 10 % by weight based on the weight of coating layer.

6. The biaxially oriented polyester film according to claim 1, wherein the polyether skeleton is derived from polytetramethylene glycol.

* * * * *